United States Patent
Michiyama

(10) Patent No.: US 9,224,883 B2
(45) Date of Patent: Dec. 29, 2015

(54) OPTICAL SENSOR

(71) Applicant: DENSO CORPORATION, Kariya, Aichi-pref. (JP)

(72) Inventor: Katsunori Michiyama, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/422,754

(22) PCT Filed: Nov. 5, 2013

(86) PCT No.: PCT/JP2013/006516
§ 371 (c)(1),
(2) Date: Feb. 20, 2015

(87) PCT Pub. No.: WO2014/097528
PCT Pub. Date: Jun. 26, 2014

(65) Prior Publication Data
US 2015/0221786 A1 Aug. 6, 2015

(30) Foreign Application Priority Data

Dec. 17, 2012 (JP) ................................. 2012-274959

(51) Int. Cl.
| H01L 31/0216 | (2014.01) |
| H04N 5/369 | (2011.01) |
| H01L 27/144 | (2006.01) |
| G01S 3/783 | (2006.01) |
| H01L 31/02 | (2006.01) |
| H01L 31/0224 | (2006.01) |

(52) U.S. Cl.
CPC ......... *H01L 31/02164* (2013.01); *G01S 3/7835* (2013.01); *H01L 27/1443* (2013.01); *H01L 31/02024* (2013.01); *H01L 31/022408* (2013.01); *H04N 5/369* (2013.01)

(58) Field of Classification Search
CPC ....................................................... H01L 31/09
See application file for complete search history.

(56) References Cited

U.S. PATENT DOCUMENTS

| 5,179,428 A | 1/1993 | Lee |
| 6,316,814 B1 | 11/2001 | Nagata et al. |
| 6,875,974 B2 | 4/2005 | Muesch et al. |

(Continued)

FOREIGN PATENT DOCUMENTS

JP 2003-258234 A 9/2003

OTHER PUBLICATIONS

International Search Report and Written Opinion dated Feb. 10, 2014 in the corresponding International Application No. PCT/JP2013/006516 (with English translation).

(Continued)

*Primary Examiner* — Alexander Ghyka
(74) *Attorney, Agent, or Firm* — Posz Law Group, PLC

(57) ABSTRACT

An optical sensor has a semiconductor substrate, an insulation film formed on the semiconductor substrate, a light receiving part formed on the semiconductor substrate, and an electrode formed on the semiconductor substrate through the insulation film. The light receiving part has a light receiving element which changes light into electric charge, and a reset element which discharges the electric charge accumulated in the light receiving element. The electrode has a first electrode applying a control voltage to the reset element. The first electrode has a light shielding property. The first electrode defines a shape of a light receiving surface of the light receiving element.

3 Claims, 5 Drawing Sheets

(56) References Cited

U.S. PATENT DOCUMENTS

| | | |
|---|---|---|
| 7,940,328 B2 | 5/2011 | Abe et al. |
| 2005/0184322 A1 | 8/2005 | Inoue |
| 2006/0249654 A1 | 11/2006 | Silsby et al. |
| 2006/0278896 A1 | 12/2006 | Inoue |
| 2010/0176272 A1 | 7/2010 | Itahashi |
| 2013/0037700 A1 | 2/2013 | Michiyama et al. |

OTHER PUBLICATIONS

Office Action mailed on Nov. 4, 2015 in corresponding JP application No. 2012-274959 (with English translation).

OPTICAL SENSOR

CROSS REFERENCE TO RELATED APPLICATION

The present disclosure is a U.S. national stage application of PCT/JP2013/006516 filed on Nov. 5, 2013 and is based on Japanese Patent Application No. 2012-274959 filed on Dec. 17, 2012, the disclosure of which is incorporated herein by reference.

TECHNICAL FIELD

The present disclosure relates to an optical sensor in which a light receiving part is formed on a semiconductor substrate.

BACKGROUND ART

Conventionally, for example, Patent Literature 1 proposes an optical sensor in which plural photo-diodes are formed on a semiconductor substrate. On the formation surface, a translucent layer having translucent property is formed. On the translucent layer, a light shielding mask having light shielding effect is formed. On the light shielding mask, plural light propagation areas are formed. In the optical sensor, an area of light incident upon a light receiving surface of the photo-diode is specified by the light propagation area of the light shielding mask.

PRIOR ART LITERATURES

Patent Literature

Patent Literature 1: U.S. Pat. No. 6,875,974 B

SUMMARY OF INVENTION

In the optical sensor shown in Patent Literature 1, two photo-diodes are arranged in a left-and-right direction as a pair, and an area of light incident upon a light receiving surface of the respective photo-diode is specified by one light propagation area located above the two photo-diodes. Therefore, when light is incident upon the optical sensor from left side, an output signal output from the right-side photo-diode becomes larger than an output signal output from the left-side photo-diode. Contrary to this, when light is incident upon the optical sensor from right side, the output signal of the left-side photo-diode becomes larger than the output signal of the right-side photo-diode. Therefore, it is possible to detect whether light is incident from the left side or the right side by comparing the output signals of the two photo-diodes.

As described above, the two photo-diodes share the one light propagation area in the optical sensor described in Patent Literature 1. This is for detecting whether light is incident from the left side or the right side. However, in order to attain this purpose, two intervals are to be secured, i.e., the interval between the left-side photo-diode and the light propagation area, and the interval between the right-side photo-diode and the light propagation area, on the semiconductor substrate. In this case, light may be incident upon an non-intended area of the semiconductor substrate, and there is a possibility that the detection accuracy of light may be lowered by electric charge produced by the light incident upon the non-intended area.

The present disclosure is aimed to provide an optical sensor in which detection accuracy of light is restricted from lowering.

According to an aspect of the present disclosure, an optical sensor includes a semiconductor substrate having a first surface on which an insulation film is formed, a light receiving part formed in an outer layer of the first surface of the semiconductor substrate, and an electrode formed on the first surface through the insulation film. The light receiving part has a light receiving element which changes light into electric charge, and a reset element which discharges the electric charge accumulated in the light receiving element. The electrode has a first electrode that applies a control voltage to the reset element. The first electrode has a light shielding property, and a shape of a light receiving surface of the light receiving element is defined by the first electrode.

According to this, the thickness of the insulation film can be set in a manner that the control voltage can be applied to the reset element. Therefore, the distance between the electrode that has the light shielding effect and that is formed on the insulation film and the first surface of the semiconductor substrate, i.e., the formation surface of the light receiving element, can be set in a manner that the control voltage can be applied to the reset element. Therefore, light is restricted from being incident upon the non-intended area of the semiconductor substrate, compared with a configuration in which a distance is secured between the light shielding layer and the photo-diode to specify the incidence angle to the photo-diode. As a result, the detection accuracy of light is restricted from being lowered by the electric charge produced by the light incident upon the non-intended area.

Moreover, the first electrode applies the control voltage to the reset element. According to this, the number of components can be restricted from increasing and the manufacture of the optical sensor can be restricted from becoming complicated, differently from a case where the shape of light receiving surface is specified by another light shielding component that is different from a component indispensable to the reset element.

In addition, in the present disclosure, the light receiving part has an active element other than the light receiving element and the reset element. The electrode has a second electrode, other than the first electrode, that applies a control voltage to the active element. The second electrode has a light shielding property, and the shape of the light receiving surface of the light receiving element is defined by not only the first electrode but the second electrode. According to this, the shape of the first electrode is restricted from being limited. Therefore, the design of optical sensor is restricted from becoming difficult.

DESCRIPTION OF EMBODIMENTS

Figure 1:
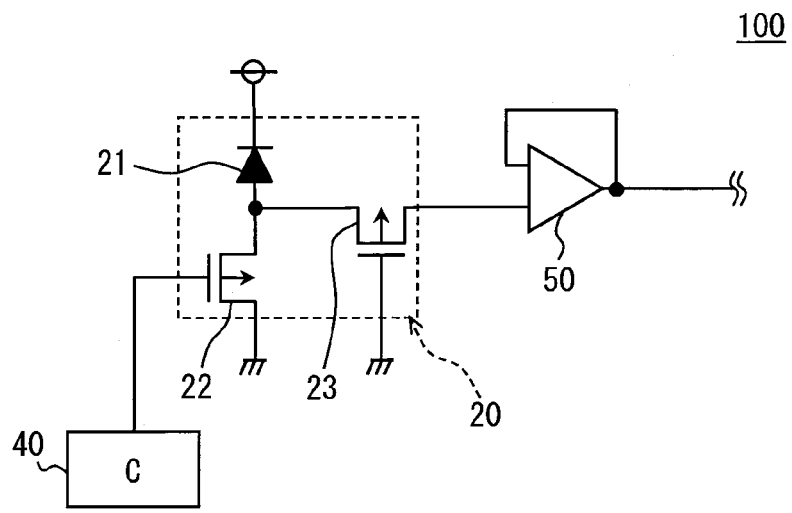
FIG. 1 is a circuit diagram illustrating an outline configuration of an optical sensor according to an embodiment.
Figure 2:
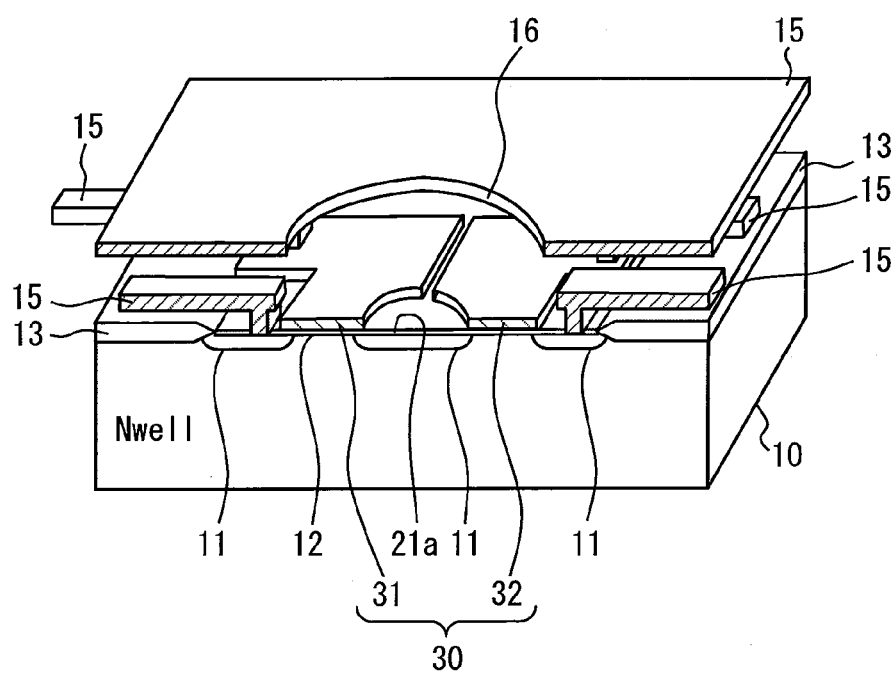
FIG. 2 is a schematic perspective view illustrating the optical sensor of the embodiment.
Figure 3:
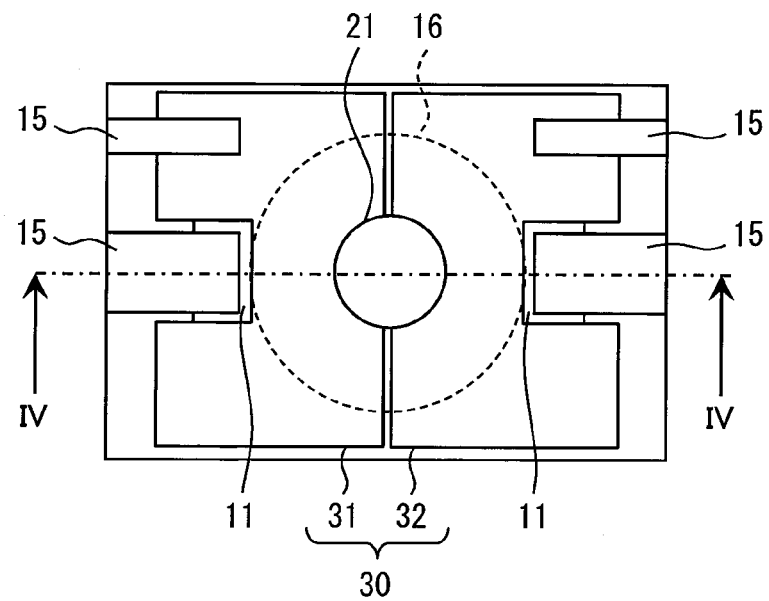
FIG. 3 is a schematic upper plan view illustrating the optical sensor of the embodiment.

An optical sensor 100 according to an embodiment is explained based on FIG. 1 to FIG. 4. In FIG. 3, an insulation film 12, a translucent film 14, and a light shielding film 15 located at the most upper layer, which are to be mentioned later, are omitted, and a dashed line represents an opening 16.

The optical sensor 100 has a semiconductor substrate 10, a light receiving part 20 formed on the semiconductor substrate 10, and an electrode 30. The light receiving part 20 has a light receiving element 21 which changes light into electric charge, and a reset element 22 which discharges the electric charge accumulated in the light receiving element 21. The light receiving element 21 further has a transmission element 23 which transmits the electric charge accumulated in the light receiving element 21. The electrode 30 has a first electrode 31 that inputs a control signal into the reset element 22, and a second electrode 32 that inputs a control voltage into the transmission element 23. Moreover, the optical sensor 100 has a control part 40 and a buffer 50 other than the above-described components 10-30. The control part 40 carries out ON/OFF control of the reset element 22, and the buffer 50 amplifies the electric charge (detection signal) of the light receiving element 21 transmitted from the transmission element 23. The transmission element 23 corresponds to an active element.

As shown in FIG. 1, the light receiving element 21 and the reset element 22 are connected in series toward a ground from a power supply source. The middle point between the elements 21 and 22 is connected to the buffer 50 through the transmission element 23. The second electrode 32 corresponding to a control electrode of the transmission element 23 is connected to the ground, and the transmission element 23 is always in ON state. Moreover, the first electrode 31 corresponding to a control electrode of the reset element 22 is connected to the output terminal of the control part 40. The reset element 22 is periodically controlled into ON state by a control signal outputted from the control part 40. Therefore, when the reset element 22 is in OFF state, the electric charge converted from light by the light receiving element 21 is accumulated in the light receiving element 21, and an electric signal according to the accumulation amount of electric charge is inputted into the buffer 50 through the transmission element 23. In contrast, when the reset element 22 is in ON state, the both-end voltage of the light receiving element 21 corresponds to the power supply voltage, and the electric charge accumulated in the light receiving element 21 is discharged.

Plural P type diffusion domains 11 that configure the light receiving part 20 are formed on the outer layer of the first surface 10a of the semiconductor substrate 10 that is Nwell domain diffused in a not-illustrated P type semiconductor substrate. The power supply source which is not illustrated is connected to the Nwell domain. The insulation film 12 and LOCOS 13 are formed on the first surface 10a, and the electrode 30 is formed on the insulation film 12. The translucent film 14 and the light shielding film 15 are layered on an area in which the electrode 30 is not formed on the insulation film 12, and LOCOS 13. The translucent film 14 is made of an electrically insulated material allowing light to pass through, and the light shielding film 15 is made of an electrically conductive material having light shielding properties. The opening 16 which specifies the angle of light incident upon the light receiving element 21 is defined in the light shielding film 15, and light passing through the opening 16 is incident upon the light receiving element 21.

As shown in FIG. 1 and FIG. 3, in this embodiment, two layers of the light shielding film 15 are layered on the first surface 10a through the translucent film 14. Of the two layers of the light shielding film 15, the light shielding film 15 adjacent to the first surface 10a mainly achieves the function of electrical connection with the circuit pattern (a part of the plural diffusion domains 11) formed on the semiconductor substrate 10. The light shielding film 15 located at the most upper layer away from the first surface 10a mainly achieves the function of restricting excessive light from entering the semiconductor substrate 10. The opening 16 of the light shielding film 15 located at the most upper layer has a plane circle shape, as shown in the dashed line of FIG. 3, and the angle of the incidence light incident upon the light receiving element 21 is specified and defined by the opening 16.

As described above, the light receiving part 20 has the light receiving element 21, the reset element 22, and the transmission element 23. As shown in FIG. 1, the light receiving element 21 is a photo-diode having the PN junction, in which the cathode terminal is connected to the power supply source and the anode terminal is connected to the ground through the reset element 22. Thereby, when the reset element 22 is set into the ON state, the both-end voltage of the light receiving element 21 corresponds to the power supply voltage, and the electric charge accumulated in the light receiving element 21 is discharged.

Each of the reset element 22 and the transmission element 23 is P channel type MOSFET. Therefore, when a Lo signal whose voltage level is lower than a Hi signal is inputted into the control electrode (the first electrode 31) of the reset element 22, the reset element 22 is set into ON state. Moreover, the control electrode (the second electrode 32) of the transmission element 23 is connected to the ground. Thereby, the transmission element 23 is always in ON state. Therefore, the anode electrode of the light receiving element 21 is always electrically connected with the buffer 50 through the transmission element 23.

As described above, the electrode 30 has the first electrode 31 and the second electrode 32. Each of the electrodes 31 and 32 is made of polysilicon, and a metal thin film is formed on the back surface of adhesion surface relative to the insulation film 12, so as to effect the light shielding property. Each of the elements 22 and 23 is P channel type MOSFET, and each of the electrodes 31 and 32 corresponds to the control electrode (gate electrode) of the respective elements 22 and 23. Therefore, the thickness of the insulation film 12 located between the respective electrode 31, 32 and the first surface 10a is set in a manner that it is possible to apply the control voltage to each of the elements 22 and 23. As shown in FIG. 3, the electrodes 31 and 32 have the same plane shape and are electrically independent from each other. Each of the electrodes 31 and 32 defines the shape of the light receiving surface 21a of the light receiving element 21 into a plane circle shape.

Figure 4:
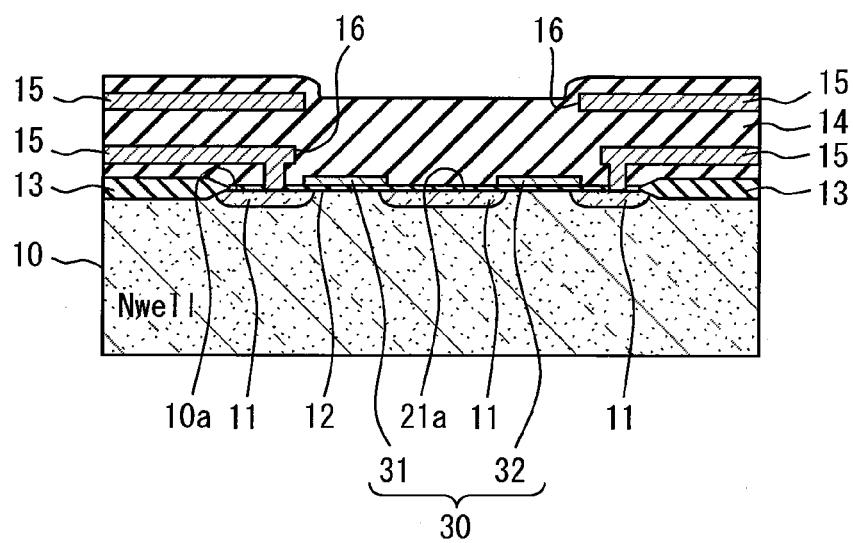
FIG. 4 is a cross-sectional view taken along a line IV-IV of FIG. 3.

Next, the internal configuration of the light receiving element 21 is explained based on FIG. 2 to FIG. 4. As described above, the P type diffusion domain 11 constructing the main part of the light receiving part 20 is formed in the outer layer of the first surface 10a of the semiconductor substrate 10. FIG. 2 to FIG. 4 show the diffusion domain 11 in connection with the light receiving element 21. As shown in FIG. 2 and FIG. 4, three of the diffusion domains 11 are formed in the outer layer of the first surface 10a. Of the three diffusion domains 11, the photo-diode having the PN junction is constructed at the boundary between the body of the semiconductor substrate 10 and the diffusion domain 11 located directly under the opening 16 (hereafter to be referred as the first diffusion domain 11). The other two diffusion domains 11 (i.e., the second diffusion domain 11 and the third diffusion domain 11) correspond to a circuit pattern.

As shown in FIG. 4, the first diffusion domain 11 is distanced from the second diffusion domain 11 located on the left side by a predetermined distance. The first electrode 31 is formed through the insulation film 12 on the first surface 10a at the position between the first diffusion domain 11 and the second diffusion domain 11. Moreover, as shown in FIG. 3, a part of the light shielding film 15 adjacent to the first surface 10a is electrically connected to the first electrode 31, and is connected to the output terminal of the control part 40. A part of the light shielding films 15 adjacent to the first surface 10a is electrically connected to the second diffusion domain 11, and is connected to the ground. Thereby, when the Lo signal is inputted into the first electrode 31 and when a channel is formed between the first diffusion domain 11 and the second diffusion domain 11, the electric charge converted from light in the first diffusion domain 11 is discharged to the ground through the channel between the first diffusion domain 11 and the second diffusion domain 11, the second diffusion domain 11, and the light shielding film 15 connected to the second diffusion domain 11.

As shown in FIG. 4, the first diffusion domain 11 is distanced from the third diffusion domain 11 located on the right side by a predetermined distance. The second electrode 32 is formed through the insulation film 12 on the first surface 10a at the position between the first diffusion domain 11 and the third diffusion domain 11. As shown in FIG. 3, a part of the light shielding film 15 adjacent to the first surface 10a is electrically connected to the second electrode 32, and is connected to the ground. A part of the light shielding film 15 adjacent to the first surface 10a is electrically connected to the third diffusion domain 11, and is connected to the transmission element 23. Thereby, a channel is always formed between the first diffusion domain 11 and the third diffusion domain 11, which are always electrically connected with each other. Therefore, the electric charge converted from light in the first diffusion domain 11 is transmitted to the buffer 50 through the channel between the first diffusion domain 11 and the third diffusion domain 11, the third diffusion domain 11, and the light shielding film 15 connected to the third diffusion domain 11.

Next, operation and effect of the optical sensor 100 of the embodiment is explained. As described above, the plane shape of the light receiving surface 21a of the light receiving element 21 is defined by each of the first electrode 31 corresponding to the control electrode of the reset element 22 and the second electrode 32 corresponding to the control electrode of the transmission element 23. The thickness of the insulation film 12 located between the electrode 31, 32 and the first surface 10a is set in a manner that it is possible to apply the control voltage to each of the elements 22 and 23. Therefore, light is restricted from entering the not-intended domain of the semiconductor substrate 10 compared with a configuration in which a predetermined distance is secured between a light shielding layer and a photo-diode in order to specify the incidence angle relative to a photo-diode. As a result, the detection accuracy of light can be restricted from being lowered by the electric charge produced by the light which is unintentionally introduced.

The first electrode 31 applies the control voltage to the reset element 22, and the second electrode 32 applies the control voltage to the transmission element 23. According to this, the number of components can be restricted from increasing and the manufacture of the optical sensor 100 can be restricted from becoming complicated, compared with a configuration in which the plane shape of the light receiving surface 21a is specified by another light shielding component that is different from a component indispensable to the reset element 22 and the transmission element 23.

Because the first electrode 31 and the second electrode 32 define the plane shape of the light receiving surface 21a, the shape of the first electrode 31 (the second electrode 32) is less limited. Therefore, the design of the optical sensor 100 can be restricted from becoming difficult.

The present disclosure is not limited to the above mentioned embodiment, and may be modified in a range not deviated from the scope of the present disclosure so as to be implemented.

Figure 5:
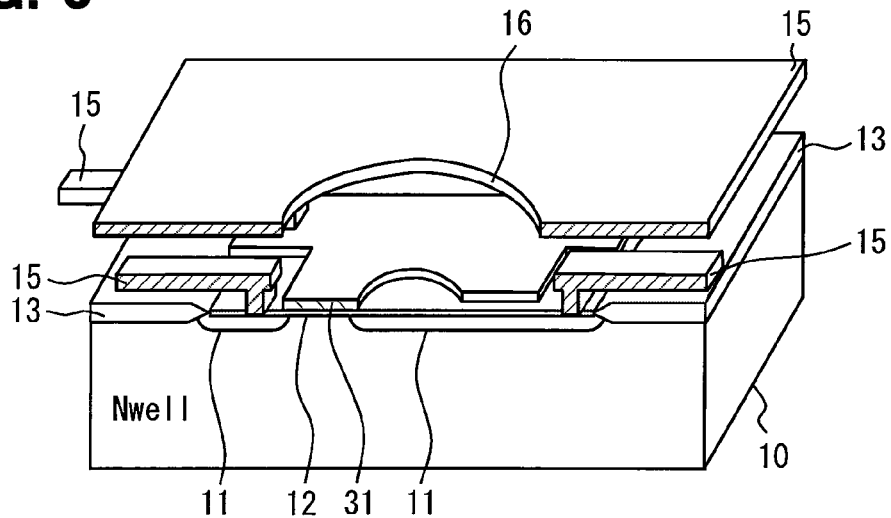
FIG. 5 is a schematic perspective view illustrating a modification of the optical sensor.
Figure 6:
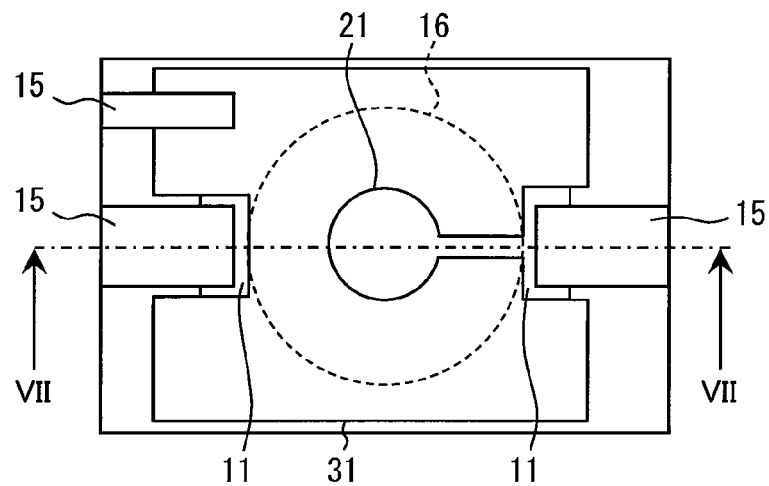
FIG. 6 is a schematic upper plan view illustrating the modification of the optical sensor.
Figure 7:
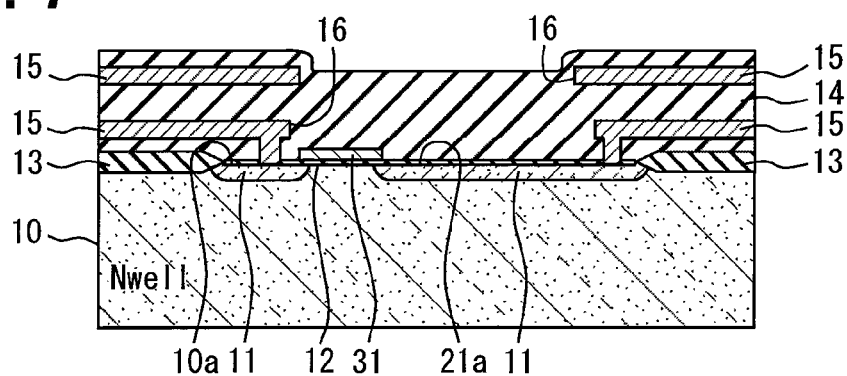
FIG. 7 is a cross-sectional view taken along a line VII-VII of FIG. 6.
Figure 8:
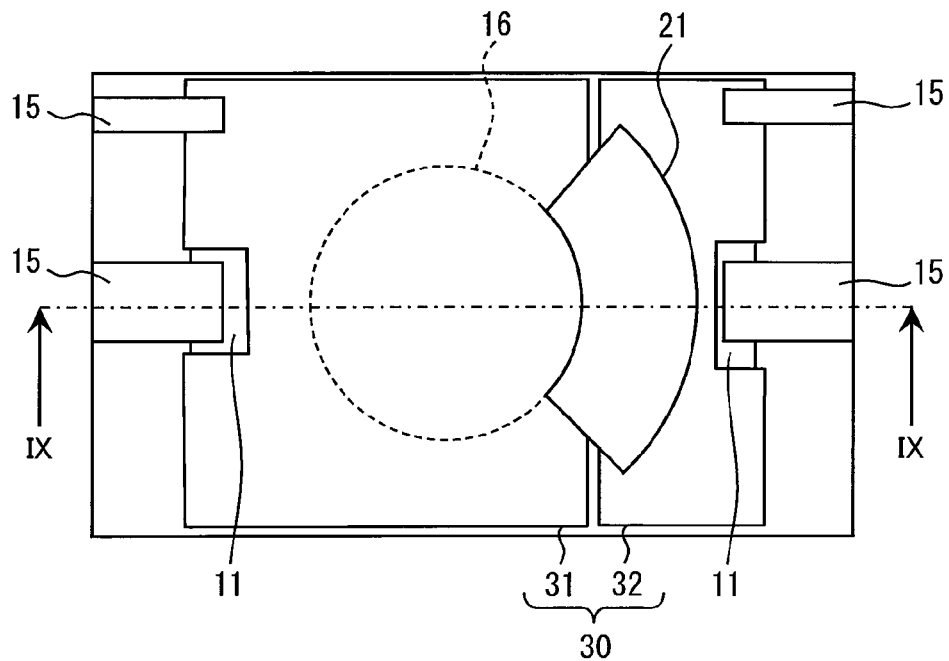
FIG. 8 is a schematic upper plan view illustrating a modification of the optical sensor.
Figure 9:
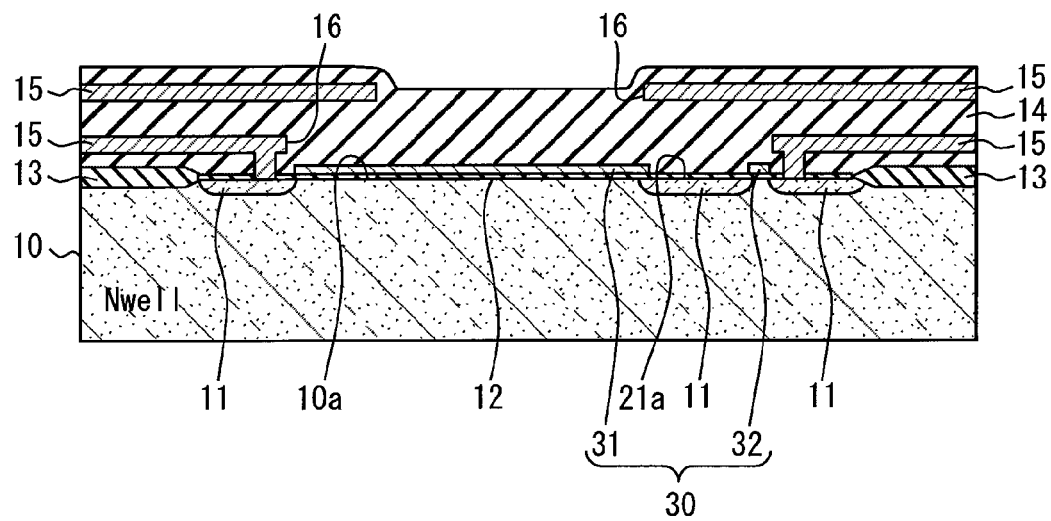
FIG. 9 is a cross-sectional view taken along a line IX-IX of FIG. 8.

In this embodiment, each of the electrodes 31 and 32 defines the plane shape of the light receiving surface 21a. However, as shown in FIG. 5 to FIG. 7, the plane shape of the light receiving surface 21a may be defined only by the first electrode 31.

Figure 10:
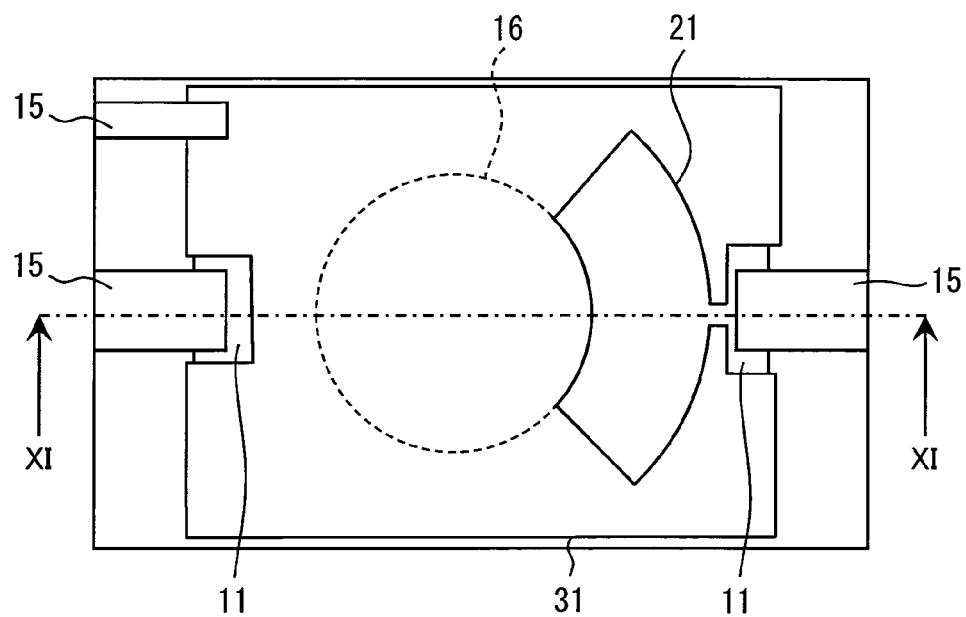
FIG. 10 is a schematic upper plan view illustrating a modification of the optical sensor.
Figure 11:
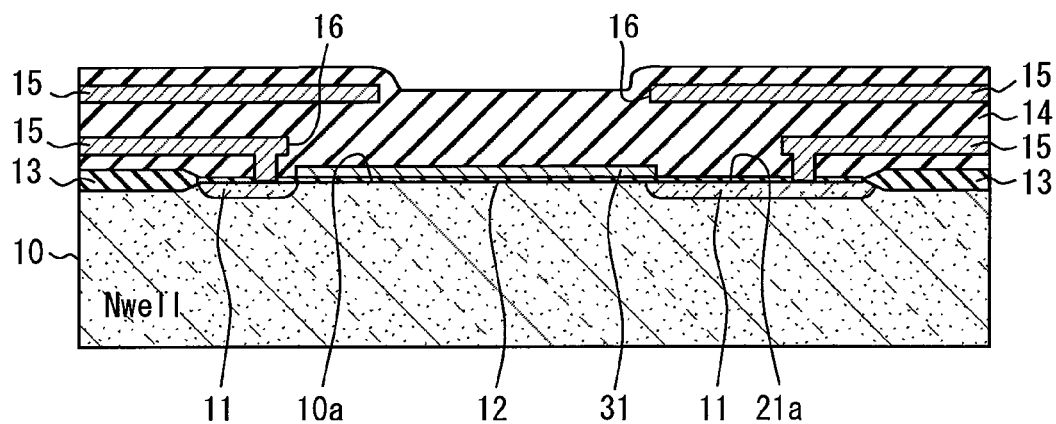
FIG. 11 is a cross-sectional view taken along a line XI-XI of FIG. 10.

In this embodiment, each of the electrodes 31 and 32 defines the plane shape of the light receiving surface 21a into the circle shape. However, as shown in FIG. 8 to FIG. 11, the plane shape of the light receiving surface 21a may be defined into an arc state. Also in this configuration, as shown in FIG. 10 and FIG. 11, the plane shape of the light receiving surface 21a may be specified only by the first electrode 31.

In this embodiment, the plane shape of the light receiving surface 21a of one light receiving element 21 is specified by the electrodes 31 and 32 respectively corresponding to the control electrodes of the reset element 22 and the transmission element 23 that correspond to the one light receiving element 21. However, although not illustrated, the plane shape of the light receiving surface 21a of one light receiving element 21 may be specified by the electrodes 31 and 32 respectively corresponding to the control electrodes of the reset element 22 and the transmission element 23 that correspond to plural light receiving elements 21.

In this embodiment, the conductivity type of the semiconductor substrate 10 is N type. However, the conductivity type of the semiconductor substrate 10 is not limited to the above-mentioned example, but P type may also be adopted. In this case, the diffusion domain 11 is N type, and each of the reset element 22 and the transmission element 23 is N channel type MOSFET. Moreover, the reset element 22 and the light receiving element 21 are connected in series toward the ground from the power supply source, and the second electrode 32 is connected to the power supply source.

In this embodiment, each of the reset element 22 and the transmission element 23 is MOSFET. However, the reset element 22 and the transmission element 23 are not limited to the above-mentioned example, and may be voltage control type transistor.

In this embodiment, of the three diffusion domains 11 constructing the main component of the light receiving part 20, each of the second diffusion domain 11 located on the left side and the third diffusion domain 11 located on the right side is a circuit pattern. However, the second diffusion domain 11 may be a part of components of the reset element 22, and the third diffusion domain 11 may be a part of components of the transmission element 23.

The invention claimed is:

1. An optical sensor comprising:
a semiconductor substrate having a first surface on which an insulation film is formed;
a light receiving part formed in an outer layer of the first surface of the semiconductor substrate; and
an electrode formed on the first surface through the insulation film, wherein:
the light receiving part has a light receiving element which changes light into electric charge, and a reset element which discharges the electric charge accumulated in the light receiving element,
the electrode has a first electrode that applies a control voltage to the reset element,
the first electrode has a light shielding property,
a shape of a light receiving surface of the light receiving element is defined by the first electrode,
the semiconductor substrate is a first conductivity type,
a plurality of diffusion layers is formed in an outer layer of the first surface of the semiconductor substrate, the plurality of diffusion layers being a second conductivity type different from the first conductivity type,
at least one of the plurality of diffusion layers forms the light receiving element, and at least one of the plurality of diffusion layers forms a circuit pattern,
the diffusion layer forming the light receiving element and the diffusion layer forming the circuit pattern are distanced from each other by a predetermined distance, and a part of the electrode is located on the first surface between the diffusion layer forming the light receiving element and the diffusion layer forming the circuit pattern, and
when a control voltage is applied to the electrode, a channel is formed between the diffusion layer forming the light receiving element and the diffusion layer forming the circuit pattern, and the diffusion layer forming the light receiving element and the diffusion layer forming the circuit pattern are electrically connected.

2. The optical sensor according to claim 1, wherein:
the light receiving part further has an active element,
the electrode further has a second electrode that applies a control voltage to the active element,
the second electrode has a light shielding property, and
the shape of the light receiving surface of the light receiving element is defined also by the second electrode.

3. The optical sensor according to claim 1, wherein:
a light shielding film is layered on the first surface of the semiconductor substrate through a translucent film,
an opening is formed in the light shielding film, and
the opening defines an angle of incidence light which is incident upon the light receiving surface of the light receiving element.

* * * * *